US007885690B2

(12) United States Patent
Shen et al.

(10) Patent No.: US 7,885,690 B2
(45) Date of Patent: Feb. 8, 2011

(54) METHODS FOR DRIVING DEVICES CAPABLE OF DISPLAYING IMAGES AND PROCESSING AUDIO MESSAGES

(75) Inventors: Jui-Hsieh Shen, Hsin-Chu (TW); Yu-Yun Hsu, Hsin-Chu (TW); Ya-Lan Chen, Ping-Tung (TW)

(73) Assignee: Toppoly Optoelectronics Corp. (TW)

( * ) Notice: Subject to any disclaimer, the term of this patent is extended or adjusted under 35 U.S.C. 154(b) by 856 days.

(21) Appl. No.: 11/320,060

(22) Filed: Dec. 28, 2005

(65) Prior Publication Data

US 2007/0159424 A1 Jul. 12, 2007

(51) Int. Cl.

| | |
|---|---|
| ***H04M 1/00*** | (2006.01) |
| ***H04M 1/64*** | (2006.01) |
| ***H04M 9/00*** | (2006.01) |
| ***H03J 7/32*** | (2006.01) |
| ***H04W 36/00*** | (2009.01) |
| ***H04B 1/38*** | (2006.01) |
| ***G09G 5/00*** | (2006.01) |
| ***G09G 3/18*** | (2006.01) |
| ***G09G 3/36*** | (2006.01) |
| ***G06F 3/038*** | (2006.01) |
| ***H04N 7/14*** | (2006.01) |

(52) U.S. Cl. ....................... 455/566; 455/145; 455/440; 455/570; 345/3.2; 345/50; 345/87; 345/213; 348/14.01; 379/88.11; 379/433.11

(58) Field of Classification Search ................ 455/29.1, 455/88.11, 93.17, 93.23, 122, 136, 142.17, 455/144.08, 167.12, 201.04, 247, 428.03, 455/433.04, 550.1, 556.1, 572, 573, 574, 455/145, 154.2, 158.4, 425, 440, 556.2, 566, 455/570; 345/3.2, 3.4, 50, 58, 68, 87, 213, 345/214, 163, 204, 209, 611, 614, 615, 616, 345/618, 646, 647, 688; 349/36, 149; 348/14.01–14.16, 348/389.1, 565, 601; 379/29.1, 88.11, 93.17, 379/93.23, 122, 136, 142.17, 144.08, 167.12, 379/201.04, 247, 428.03, 433.01, 433.04

See application file for complete search history.

(56) References Cited

U.S. PATENT DOCUMENTS 6,046,737 A * 4/2000 Nakamura .................. 345/213
6,445,937 B1 * 9/2002 daSilva ....................... 455/574

(Continued)

FOREIGN PATENT DOCUMENTS

JP 11-313273 11/1999

(Continued)

OTHER PUBLICATIONS

Taiwanese Office Action mailed Apr. 3, 2008.

*Primary Examiner*—Nay Maung
*Assistant Examiner*—Paul P Tran
(74) *Attorney, Agent, or Firm*—Thomas, Kayden, Horstemeyer & Risley, LLP

(57) ABSTRACT

Methods for driving devices capable of displaying images and processing audio messages are provided. A representative method comprises: operating a device capable of displaying images and processing audio messages at a first operating frequency when the device is not processing audio messages; and operating the device at a second operating frequency higher than the first frequency when the device is processing audio messages.

16 Claims, 4 Drawing Sheets

U.S. PATENT DOCUMENTS

| | | | | |
|---|---|---|---|---|
| 7,091,967 | B2 * | 8/2006 | Gong et al. | 345/213 |
| 7,505,795 | B1 * | 3/2009 | Lim et al. | 455/574 |
| 2003/0193464 | A1 * | 10/2003 | Yamano et al. | 345/89 |
| 2004/0017505 | A1 * | 1/2004 | Yamauchi | 348/370 |
| 2007/0133071 | A1 * | 6/2007 | Noyes et al. | 358/516 |
| 2008/0008313 | A1 * | 1/2008 | Fyke | 379/433.01 |

FOREIGN PATENT DOCUMENTS

| | | | | |
|---|---|---|---|---|
| JP | 2003131192 | A | * | 5/2003 |
| JP | 2003319017 | A | * | 11/2003 |
| KR | 10-2005-0018001 | | | 2/2005 |
| TW | I228923 | | | 3/2005 |
| TW | I230310 | | | 4/2005 |

* cited by examiner

| Bias mode | Bit[4:3] | Bit[5],[2:0] | Meaning |
|---|---|---|---|
| 1 | 00 | | -5% Default frequency |
| 2 | 01 | | Default frequency |
| 3 | 10 | | +5% Default frequency |
| 4 | 11 | | +10% Default frequency |
| 5 | | 0,000 | 1.82MHz (Default frequency) |
| 6 | | 1,000 | $\frac{3}{4}$*1.82MHz |
| 7 | | 0,001 | $\frac{1}{2}$*1.82MHz |
| 8 | | 0,010 | 1.5MHz |
| 9 | | 1,010 | $\frac{3}{4}$*1.5MHz |
| 10 | | 0,011 | $\frac{1}{2}$*1.5MHz |
| 11 | | 0,100 | 0.9MHz |
| 12 | | 1,100 | $\frac{3}{4}$*0.9MHz |
| 13 | | 0,101 | $\frac{1}{2}$*0.9MHz |

Fig. 4

METHODS FOR DRIVING DEVICES CAPABLE OF DISPLAYING IMAGES AND PROCESSING AUDIO MESSAGES

BACKGROUND OF THE INVENTION

1. Field of the Invention

The present invention relates to devices capable of displaying images and processing audio messages.

2. Description of the Prior Art

Liquid crystal displays (LCDs) are used in a variety of small-sized devices such as cellular phones and personal digital assistant (PDA) devices. These small-sized devices usually require an extremely small pitch of connections of a driver large-scale integrated circuit (LSI). Hence, an LCD driving device is generally used, which integrally incorporates a driver by using polysilicon thin film transistors (TFTs). A TFT LCD panel thus comprises a matrix of pixels, thousands or millions of which together create an image on the display, and corresponding TFTs acting as switches individually to turn each pixel on or off. Since many of these small-sized devices are portable, battery-operated devices, low power consumption is an important display attribute. For devices such as mobile phones and PDAs with TFT LCD panels, that can display images and receive audio messages, screen flicker and audible noise are also important concerns.

Reference is made to FIG. 1, which schematically depicts a portion of a prior art TFT LCD panel 10. A pixel element 12 of the TFT LCD panel 10 includes a storage capacitor Cs and a liquid crystal capacitor CLC for data storage. A TFT 14, acting as a switch for turning the pixel element 12 on or off, is controlled by a gate voltage typically applied with between −5V to 20V by a power line GATE. The video source provided by a power line SOURCE, typically ranging from 0V and 10V, provides the intensity information that appears across the pixel element 12. A bottom of the pixel element 12 is commonly connected to a back plane of the panel. The voltage at this node is known as Vcom.

In a TFT LCD device, the magnitude of the applied source voltage determines the intensity of light emitted by the pixel. Assuming the Vcom voltage is at ground, the voltage across the pixel varies from 0 V to 10 V. Assuming an average of 5 volts, there is substantial DC voltage across each pixel. This DC voltage causes charge storage, or memory. In the long term, this DC voltage ages and degrades the pixels by electroplating ion impurities onto one of the electrodes of the pixel. This contributes to image retention, commonly known as a sticking image. For preventing orientation films and liquid crystals from deteriorating due to electrochemical reactions, as well as preventing sticking or persistence of image, the polarity of the pixel voltage is reversed on alternate intervals, known as the frame rate of the TFT LCD panel. The typical frame rate used for the TFT LCD panel is about 60 Hz.

Flicker is an artifact that makes an image appear to flash rather than retain steady brightness. The minimum frequency at which a modulated source is perceived as steady is known as the critical flicker frequency (CFF). Flicker is perceived when the frequency of modulated light falling on the retina of the human eye is below the CFF. Since the field display rate a measurement of how quickly a display device can produce unique consecutive images called frames), as well as the effective frame rate (the average field display rate of a display device), of most displays are below most people's CFF, flicker is often noticeable and detracts from the image quality. By operating a TFT LCD panel with a higher frame rate, the undesirable flicker effect can be significantly reduced.

Also, the noise level is related to Vcom driving signal frequency. For a TFT LCD panel with QVGA resolution (240×RGB×320), the Vcom frequency can be represented as follows:

$$\text{Vcom frequency} \approxeq \text{frame rate (usually 60 Hz)} \times 160 = 9.6\ \text{kHz}$$

Though this noise level is very low, it is still noticeable when the TFT LCD device is put close to a human ear. This can happen when a user talks with a cellular phone or a PDA after receiving or making a phone call. The audible noise within close vicinity to the TFT LCD device is undesirable since the noise can affect the quality of communication.

In the prior art, the frame rate for driving a TFT LCD panel is fixed. To reduce the undesirable flicker effect and the noise level, a conventional method is usually applied by operating the TFT LCD panel with a higher frame rate. However, the power consumption of the TFT LCD panel is proportional to $\frac{1}{2}CV^2F$, where F is operating frequency, V is operating voltage and C is panel capacitance. Therefore, while higher frame rate reduces flicker and noise significantly, it also increases the power consumption of the TFT LCD device. Thus, the prior art method reduces flicker and noise by operating the TFT LCD device at a fixed higher frame rate, but it also increases the overall power consumption.

SUMMARY OF THE INVENTION

Methods for driving devices capable of displaying images and processing audio messages are provided. An embodiment of such a method comprises: operating a device capable of displaying images and processing audio messages at a first operating frequency when the device is not processing audio messages; and operating the device at a second operating frequency higher than the first frequency when the device is processing audio messages.

Another embodiment of a method comprises: operating the device at a first operating frequency when the device is not outputting sound corresponding to information received by the device; and operating the device at a second operating frequency higher than the first operating frequency response to the device outputting such sound.

Systems capable of displaying images and processing audio messages are provided. An embodiment of such a system comprises: means for operating the system at a first operating frequency when the system is not processing audio messages; and means for operating the system at a second operating frequency higher than the first operating frequency when the system is processing audio messages.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a table listing bias modes of an embodiment of a voltage control oscillator.

DETAILED DESCRIPTION

Cellular phones and PDAs using TFT LCD panels are examples of TFT LCD devices capable of displaying images and processing audio messages. For ease of explanation, a TFT LCD cellular phone is used for illustrating the present invention. In this regard, the frame rate for driving a TFT LCD panel of a cellular phone is adjusted based on the noise level trend. When the cellular phone is operating in a normal mode in which audio messages are not being processed, the frame rate for driving the TFT LCD panel is set at a typical value (e.g. 60 Hz) in order to keep the flicker and the power consumption at an acceptable level. When the cellular phone is processing audio signals such as when receiving or making phone calls, the frame rate for driving the TFT LCD panel of the cellular phone is raised to a higher value (e.g. 75 Hz) so that the Vcom frequency is also increased (e.g. from 9.6 kHz to 12 kHz). The higher Vcom frequency makes the noise of the TFT LCD panel less perceivable to the human ear even if the cellular phone is held very close to a user's ear. Therefore, the quality of audio signals is potentially greatly improved.

After the cellular phone finishes processing audio messages, the cellular phone typically is moved away from the user's ear and a very low noise level is no longer required. At this distance, the TFT LCD panel of the cellular phone typically offers an acceptable noise level with the original Vcom frequency (e.g. 9.6 kHz). Therefore, the frame rate of the TFT LCD panel is again set to the typical value (e.g. 60 Hz) in order to lower the power consumption.

Figure 1:
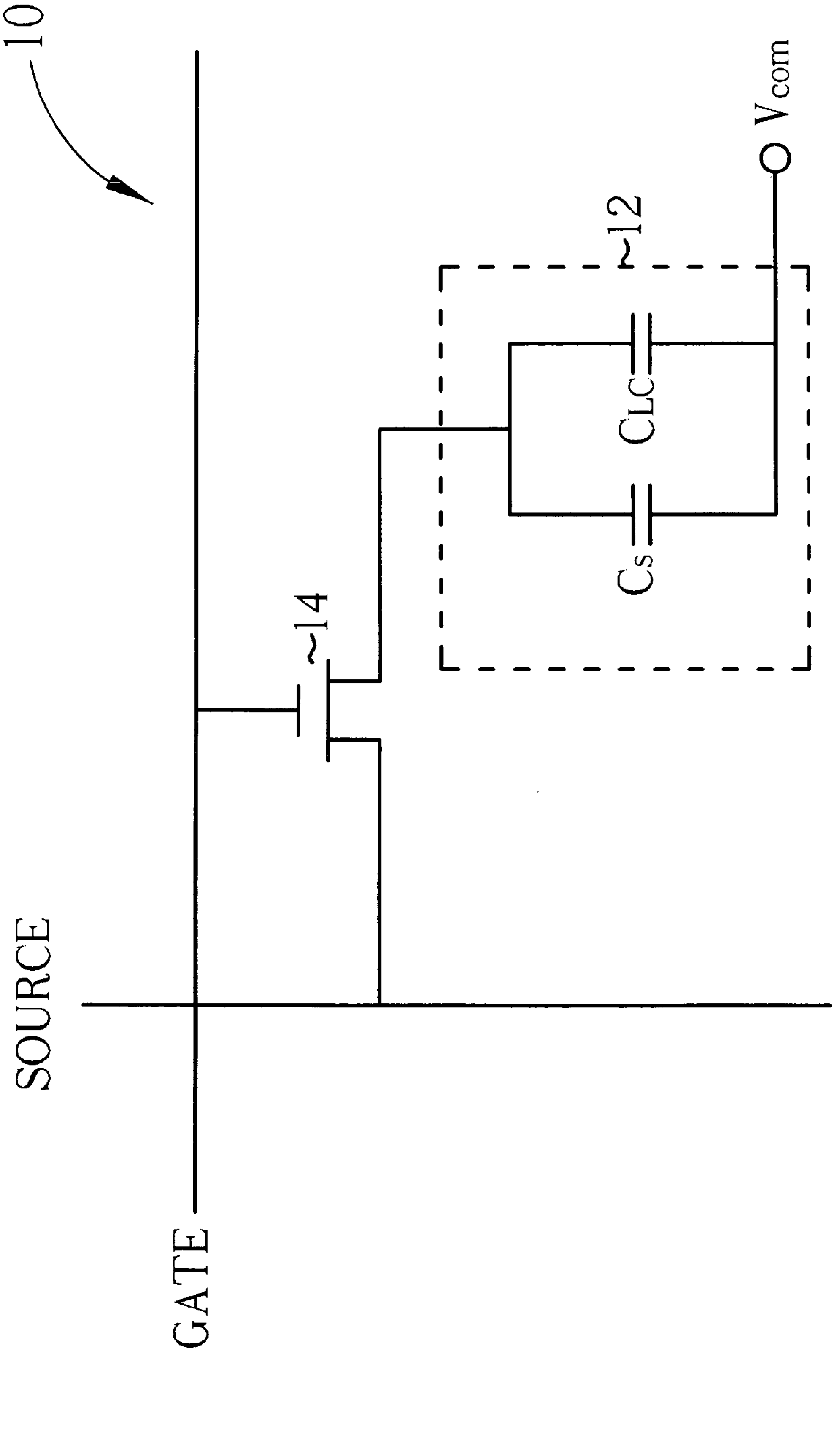
Fig. 1 Prior Art
FIG. 1 shows a driving circuit of a LCD pixel in a TFT LCD panel according to the prior art.
Figure 2:
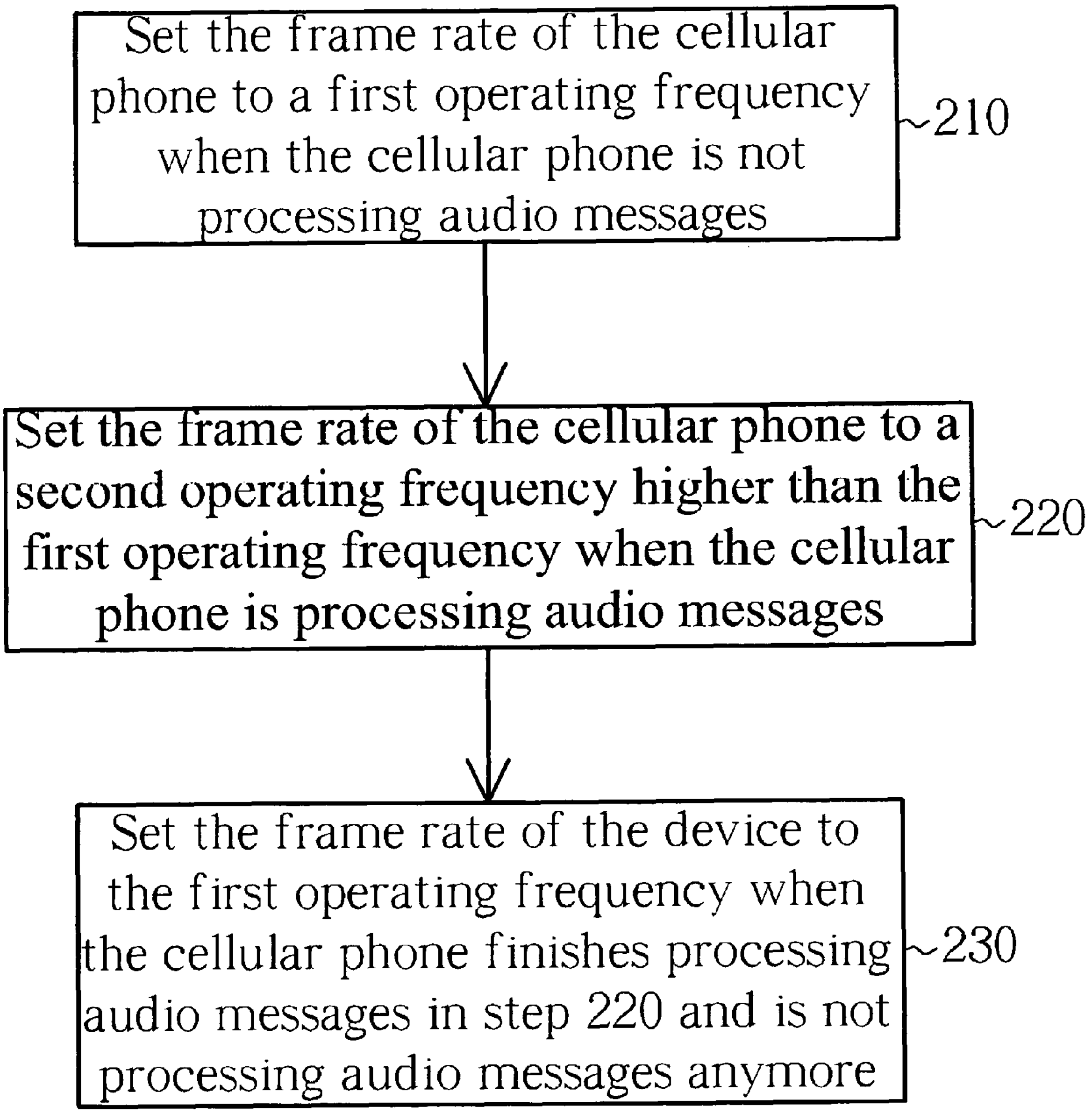
FIG. 2 is a flowchart illustrating an embodiment of a method of driving a device capable of displaying images and processing audio images.

Reference is made to FIG. 2, which is a flowchart illustrating an embodiment of a method of driving a cellular phone. The method in FIG. 2 includes the following steps:

Step 210: set the frame rate of the cellular phone to a first operating frequency when the cellular phone is not processing audio messages;

Step 220: set the frame rate of the cellular phone to a second operating frequency higher than the first operating frequency when the cellular phone is processing audio messages; and Step 230: set the frame rate of the device to the first operating frequency when the cellular phone finishes processing audio messages in step 220.

Figure 3:
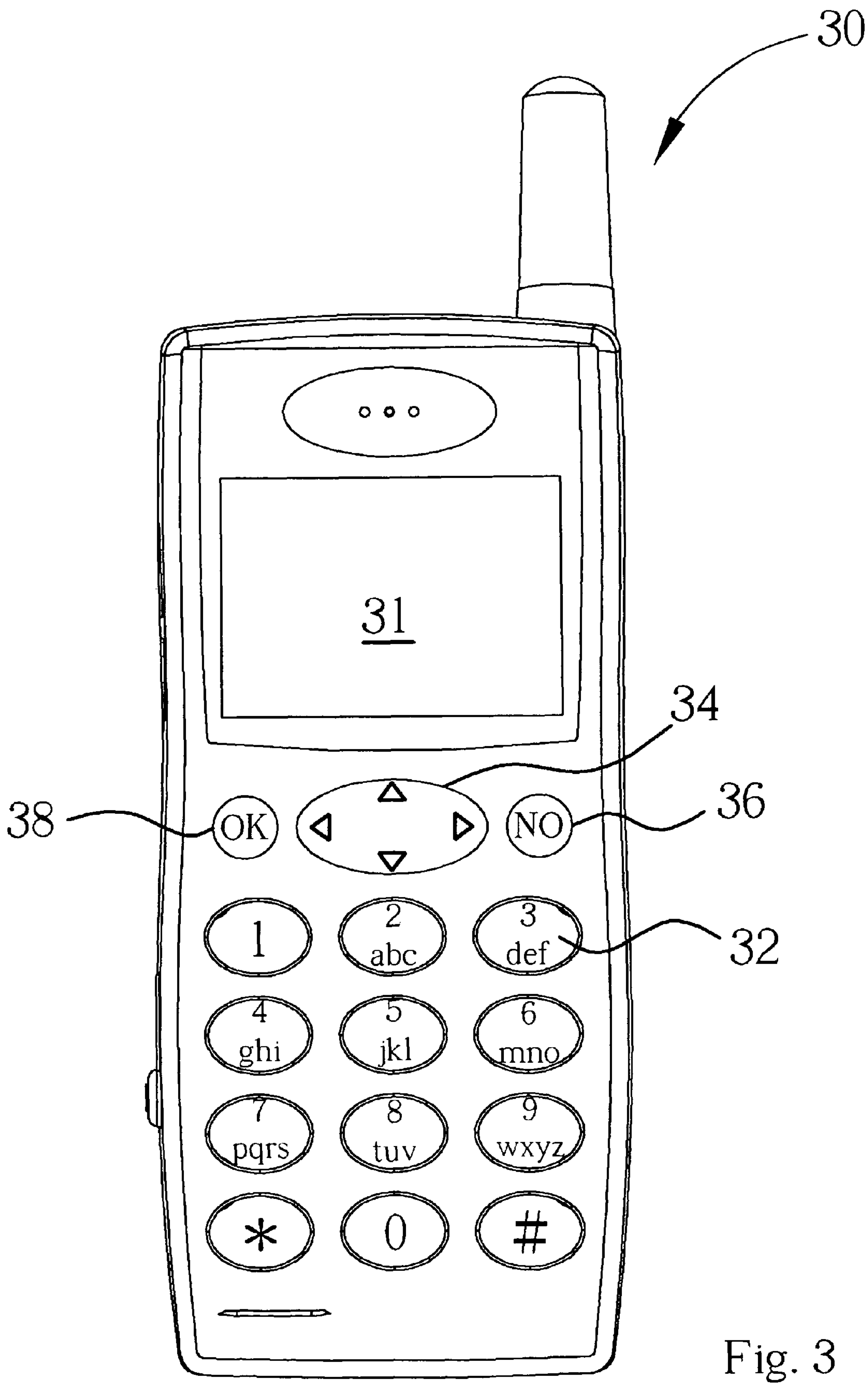
FIG. 3 is a front view of an embodiment of a cellular phone.

In cellular phone embodiments, many control buttons are usually disposed on the TFT LCD panel of the cellular phone for various functions. Please refer to FIG. 3 for a front view of a typical cellular phone 30. The cellular phone 30 includes a TFT LCD panel 31 and a plurality of control buttons 32, 34, 36 and 38. The control buttons 32 are number keys for inputting phone numbers, the control button 34 is used for selecting from menu items shown on the panel 31, the control button 36 can be used to cancel a selection or exit a current menu, and the control button 38 is used to execute the current selection, make/answer calls or end a current call. The typical operations of the cellular phone 30 involving processing audio messages include:

Operation 1: The cellular phone 30 rings when receiving an incoming phone call, the user presses the control button 38, and puts the cellular phone 30 near the ear for a subsequent conversation;

Operation 2: The user dials a phone number through the control buttons 32, presses the control button 38 for making the phone call and puts the cellular phone 30 near the ear for a subsequent conversation; and Operation 3: When the conversation is over, the user presses the control buttons 32 for ending the phone call.

Signals from the control button 38 in operations 1 and 2 indicate the cellular phone 30 is about to process audio messages. Thus, the noise level can be reduced further since the cellular phone 30 will be held very close to the user's ear. Signals from the control button 38 in operation 3 indicate the cellular phone 30 is about to finish processing audio messages and be moved away from the user's ear, thus a very low noise level may no longer be required. In this regard, when the cellular phone 30 is not processing audio messages, the frame rate is set to the first frequency (such as depicted in step 210), with which noises are usually imperceptible as long as the cellular phone 30 is not held near the user's ear. Setting the frame rate to a higher frequency can be initiated by signals from the control button 38 in operations 1 and 2. When the user presses the control button 38 for receiving incoming phone calls or making new phone calls, the frame rate of the cellular phone 30 can be increased to the second operating frequency, resulting in a higher Vcom frequency that makes the noise of the cellular phone 30 less perceivable to the human ear. Therefore, even if the cellular phone 30 is held very close to the user's ear, the associated noises may not influence the communication quality. Setting the frame rate to a lower operating frequency can be initiated by signals from the control button 38 in operation 3 when the user presses the control button 38 again for ending a phone call. Since the cellular phone 30 is not processing audio messages after the user ends the phone call, the phone typically is moved away from the user's ear and a very low noise level is no longer required. Therefore, the frame rate of the cellular phone 30 can again be set to a lower operating frequency, such as the first operating frequency, to prevent higher power consumption when operating at the second frequency.

Unlike the prior art method, in this embodiment, the frame rate of the TFT LCD device is adjustable based on the required noise level trend. When the TFT LCD device is not processing audio messages, the frame rate is set to a typical frequency for keeping the flicker and the power consumption at an acceptable level. When the TFT LCD device is processing audio messages and a lower noise level is required, the frame rate is set to a higher frequency for reducing the noise level. Since the frame rate of the TFT LCD device is set to a higher value when a lower noise level is required and typically remains at the typical value during other operations, the overall power consumption of the TFT LCD only increases slightly.

Many approaches can be employed for changing the frame rate. For example, if the TFT LCD device uses a central processing unit (CPU) interface, an LCD driver for driving the device includes a voltage-controlled oscillator (VCO). Reference is made to FIG. 4 for a table illustrating an example of bias modes of an embodiment of such a VCO. The bias modes of the VCO are determined by 6-bit data. Bits 3 and 4 determine the shift range of the default VCO, and Bits 0-2, 5 determine the VCO default frequency. As shown in FIG. 4, the VCO frequency can be adjusted by changing Bits 0-5. By giving commands to the LCD driver of the TFT LCD device through interfaces such as a serial-peripheral interface (SPI) or an inter-IC bus (I2C), the frame rate of the TFT LCD device can be selected from the bias modes 5-1 3. For example, as shown in FIG. 2, the frame rate of the TFT LCD device is set according to the bias mode 5, in which a VCO frequency of 1.82 MHz results in a frame rate of about 60 Hz when the TFT LCD device is not processing audio messages, and according to the bias mode 4, in which a VCO frequency of 2 MHz results in a frame rate of about 72 Hz when the TFT LCD device is processing audio messages. On the other hand, if the TFT LCD device uses a serial/parallel RGB (red, green, blue) interface type panel, the user can adjust the frame rate by changing the main clock frequency at the CPU of the user end.

The cellular phone 30 is used for illustrating the present invention, but does not limit the scope of the present invention. The present invention can be applied to cellular phones with other panel layouts and designs, such as folding cellular phones, or to other devices capable of displaying images and processing audio messages, such as PDAs. The approaches with which step 220 and step 230 are initiated can also vary for different devices. For example, when the present invention is applied to a folding cellular phone, step 220 can be initiated by opening the front cover of the folding cellular phone for receiving calls, or by pressing a control button indicating the desired number has been dialed for making a call. Step 230 can be initiated by closing the front cover for ending a call, or by pressing a control button indicating the call is already over. Other approaches with similar functions can also be adopted for initiating step 220 and step 230 in the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for driving an audio device which adopts a panel for displaying images at a frame rate, the method comprising:

operating the panel at a first frame rate frequency when the audio device is not processing audio messages;

operating the panel at a second frame rate frequency higher than the first frame rate frequency in response to the audio device processing an audio message associated with receiving or making a phone call; and reducing current frame rate frequency from the second frame rate frequency to the first frame rate frequency in response to termination of processing the audio message;

wherein the frame rate is measured by reversal of polarity of pixel voltages in alternating intervals.

2. The method of claim 1 being a method for driving an audio device which adopts a serial/parallel RGB (red, green, blue) interface type panel.

3. The method of claim 1 being a method for driving an audio device which adopts a CPU (central processing unit) interface type panel.

4. The method of claim 1 being a method for driving a PDA (personal data assistant) or a smart phone.

5. The method of claim 1 being a method for driving a cellular phone.

6. The method of claim 1 being a method for driving an audio device adopting a TFT LCD panel.

7. A method for driving an audio device, which adopts a panel for displaying images, said method comprising;

operating the panel at a first frame rate frequency when the audio device is not outputting sound corresponding to information received by the audio device associated with a phone call;

operating the panel at a second frame rate frequency higher than the first frame rate frequency in response to the audio device outputting the sound; and reducing current frame rate frequency of the panel from the second frame rate frequency to the first frame rate frequency in response to termination of the outputting of the sound.

8. The method of claim 7, wherein the audio device is a cellular phone.

9. The method of claim 7, wherein the information received is carried by a cellular phone signal.

10. An audio system comprising:

a panel for displaying images at a frame rate; means for operating the panel at a first frame rate frequency when the audio system is not processing an audio message associated with receiving or making a phone call;

means for operating the panel at a second frame rate frequency higher than the first frame rate frequency in response to the audio system processing the audio message; and reducing current frame rate frequency from the second frame rate frequency to the first frame rate frequency in response to termination of processing the audio message;

wherein the frame rate is measured by reversal of polarity of pixel voltages in alternating intervals.

11. The audio system of claim 10 wherein the panel is a serial/parallel RGB interface type panel.

12. The audio system of claim 10 wherein the panel is a CPU interface type panel.

13. The audio system of claim 10 being a PDA or a smart phone.

14. The audio system of claim 10 being a cellular phone.

15. The audio system of claim 10 wherein the panel is a TFT LCD panel.

16. The audio system of claim 10 wherein the first frame rate frequency is 60 Hz.

* * * * *